United States Patent [19]
Sato et al.

[11] Patent Number: 5,858,816
[45] Date of Patent: Jan. 12, 1999

[54] METHOD FOR PRODUCING CIRCUIT BOARD, FOR SEMICONDUCTOR PACKAGE, HAVING CAVITY FOR ACCOMMODATING SEMICONDUCTOR ELEMENT

[75] Inventors: Hiroaki Sato; Masayoshi Ebe, both of Nagano, Japan

[73] Assignee: Shinko Electric Industries Co., Nagano, Japan

[21] Appl. No.: 991,182

[22] Filed: Dec. 16, 1997

[30] Foreign Application Priority Data

Dec. 17, 1996 [JP] Japan ................................ 8-337045

[51] Int. Cl.$^6$ ..................................................... H01L 21/44
[52] U.S. Cl. .......................................... 438/125; 437/121
[58] Field of Search ................................. 439/121, 122, 439/123, 124, 125, 126

[56] References Cited

U.S. PATENT DOCUMENTS

| | | | |
|---|---|---|---|
| 4,965,227 | 10/1990 | Chang et al. ............................. | 438/123 |
| 5,205,036 | 4/1993 | Yamazaki ................................ | 438/123 |
| 5,441,918 | 8/1995 | Morisaki et al. ........................ | 438/122 |
| 5,474,957 | 12/1995 | Urushima ................................ | 438/122 |
| 5,556,807 | 9/1996 | Bhattacharyya et al. ................ | 438/123 |
| 5,557,502 | 9/1996 | Banerjee et al. . | |
| 5,599,747 | 2/1997 | Bhatt et al. ............................. | 438/125 |
| 5,607,883 | 3/1997 | Bhattacharyya et al. ................ | 438/125 |
| 5,643,818 | 7/1997 | Sachdev et al. ......................... | 438/125 |

FOREIGN PATENT DOCUMENTS 4-32252  2/1992  Japan .

Primary Examiner—Kevin Picardat
Attorney, Agent, or Firm—Staas & Halsey

[57] ABSTRACT

In a method for producing a circuit board for a semiconductor package, portions of the resist film formed on the respective surface of the core substrate are removed during the exposure/development process, which portions correspond to the circuit pattern and to the cavity opening but having a diameter smaller than that of the cavity opening, whereby the photosensitive portion of the resist film is hardened while extending inward from the upper edge of the cavity opening to a predetermined distance. The resist film operates as a resist for the conductor layer to be formed on the inner wall of the cavity opening and connected to the circuit pattern on one surface of the core substrate. Thereby, since the finally formed conductor layer does not reach the upper edge of the cavity opening at a predetermined vacant space therefrom, short-circuiting of the signal line is prevented from occurring even if the bonding wire is brought into contact with the upper edge of the cavity opening. Thus, it is possible to improve the yield in the production of plastic packages as well as the quality of the resultant packages.

11 Claims, 3 Drawing Sheets

METHOD FOR PRODUCING CIRCUIT BOARD, FOR SEMICONDUCTOR PACKAGE, HAVING CAVITY FOR ACCOMMODATING SEMICONDUCTOR ELEMENT

BACKGROUND OF THE INVENTION

1. Field of the Invention

The present invention relates to a method for producing a circuit board, for a semiconductor package, comprising a core substrate covered with metallic layers on the opposite surfaces thereof and having an opening for a cavity for accommodating a semiconductor element, wherein the cavity opening has a conductive layer on an inner wall thereof to be connected with a circuit pattern carried on one surface of the core substrate.

2. Description of the Related Art

A prior art method for producing a circuit board for a semiconductor package such as a plastic package or the like will be described with reference to FIGS. 4(a) to 4(i). An opening 54 for a cavity (herein after referred to as "a cavity opening") is formed by means of a drill (see FIG. 4(b)) in a copper-clad substrate 53 (see FIG. 4(a)) prepared by overlaying copper foils 52 on the opposite surfaces of a core substrate made of a glass cloth or others. Onto the inner wall of the cavity opening 54 of the copper-clad substrate 53 is applied an electroless plating of copper and then an electroplating of copper to form a copper-plating film 55 on the opposite surfaces of the copper-clad substrate 53 as well as the inner wall of the cavity hole 54 (see FIG. 4(c)). In this regard, alternatively to the electroless plating of copper described above, after forming a palladium core on the inner wall of the cavity opening 54, an electroplating may be applied thereto.

Next, a photosensitive resist film 56 is formed on the opposite surfaces of the copper-clad substrate 53 (by, for example, a hot-press bonding of a dry film) (see FIG. 4(d)), and a photo-mask is overlaid with the resist layer 56, on which an exposure/development process is carried out. Thereby, a portion 56a of the photosensitive film 56 corresponding to a circuit pattern is hardened and left after a non-exposed portion 56b covered with the mask is dissolved (see FIG. 4(e)).

Thereafter, a tin-plating or solder-plating layer 57 is formed on a portion where the copper-plating film 55 is exposed on the copper-clad substrate 53 (corresponding to the circuit pattern) (see FIG. 4(f)). After the copper-plating film 55 exposed by peeling the photosensitive portion 56a of the photosensitive resist film 56 on the copper-clad substrate 53 and the copper foil 52 disposed beneath the same is removed by the etching (see FIG. 4(g)), the tin-plating or solder-plating layer 57 is removed by the dissolution, whereby a circuit pattern such as a signal line or a power source line covered with the copper-plating film 55 is formed on the opposite surfaces of the copper-clad substrate 53, and a conductive layer 55a to be connected with a circuit pattern such as a ground layer on the lower surface of the core substrate 51 is formed on the inner wall of the cavity opening 54 (see FIG. 4(h)).

After a semiconductor element 59 such as an LSI is accommodated in a cavity formed by bonding a heat-radiation plate 58 or the like on the lower surface of the copper-clad substrate 53, the signal lines or the power source lines formed on the upper surface of the copper-clad substrate 53 are connected with bonding pads of the semiconductor element 59 by a wire-bonding so that the semiconductor element is electrically connected to the circuit pattern via bonding wires 60 (see FIG. 4(i)).

In the cavity area, since the photo-mask overlaid with the photosensitive resist film 56 is formed along a profile of the periphery of the cavity opening 54, a deviation is liable to occur between the actual circuit pattern and the photo-mask.

Specifically, since the glass cloth used as the core substrate 51 is contractible or expandable due to heat, the core substrate 51 on which the dry film is bonded by a hot-press bonding is mobile prior to being subjected to the exposure/development process to deviate from the photo-mask. For example, as shown in FIG. 4(e), if the core substrate 51 expands, the portion 56a of the photosensitive resist film 56 may be displaced away from an upper periphery 54a of the cavity opening 54. When the conductive layer 55a is formed on the inner wall of the cavity opening 54, as shown in FIG. 4(c), for the purpose of the electrical conduction with the circuit pattern provided on the lower surface of the core substrate 51, the conductive layer 55a is formed even in an area wherein no conductive pattern is required, as shown in FIG. 4(h), if the photosensitive resist film 56 deviates from the upper periphery 54a.

Thereby, as shown in FIG. 4(i), when the wire-bonding is carried out after the semiconductor element 59 is accommodated in the cavity formed by bonding the heat radiation plate 58 with the lower surface of the copper-clad substrate 53, there is a risk in that the bonding wires 60 may be brought into contact with an edge 61 of the conductive layer 55a formed on the upper periphery 54a of the cavity opening 54. That is, since a bonding finger moves from the inside to the outside of the cavity opening 54 during the wire-bonding so that the bonding wire 60 streches from the bonding pad of the semiconductor element 59 within the cavity to that of the signal line or the power source line formed on the upper surface of the copper-clad substrate 53, there is a risk of the bonding wire 60 contacting the edge 61 of the conductive layer 55a formed on the upper periphery 54a, resulting in a short-circuit.

SUMMARY OF THE INVENTION

Accordingly, an object of the present invention is to solve the above problems in the prior art, and provide a method for producing a circuit board for a semiconductor package, in which a short-circuit accident cannot be caused by contact between a bonding wire and a conductive layer formed on the inner wall of a cavity when a semiconductor element accommodated in a cavity is wire-bonded to a circuit pattern formed in a core substrate.

The above object is achievable by a method comprising the steps of forming an opening for a cavity for accommodating a semiconductor element at a predetermined portion of a core substrate having metallic layers on both surfaces thereof, forming a first plating film on the inner wall of the cavity opening to be connected with a circuit pattern formed on at least one surface of the core substrate, forming a resist film on both the surfaces of the core substrate so that the cavity opening is covered, removing a portion of the resist film corresponding to the circuit pattern on the core substrate and a portion thereof corresponding to the cavity opening but having a diameter smaller than that of the cavity opening by an exposure/development process, forming a second plating film while using the resist film as a mask, on a portion corresponding to the circuit pattern exposed on the core substrate and the first plating film formed on the inner wall of the cavity opening, releasing the resist film from both the surfaces of the core substrate, removing a portion of the first plating film exposed on the core substrate and the underlying metallic layer, and removing the second plating film covering the portion corresponding to the circuit pattern of the core substrate and the inner wall of the cavity opening.

The step for forming the first plating film may be carried out by applying an electroless plating of copper or copper alloy and subsequently applying an electro-plating of copper or copper alloy.

Alternatively, the step of forming the first plating film may be carried out by adhering palladium cores on the inner wall of the cavity opening and subsequently applying an electro-plating of copper or copper alloy.

An electro-plating of copper or copper alloy may be applied to the portion corresponding to the circuit pattern carrying the first plating film prior to applying the second plating.

Preferably, a photosensitive film is used as the resist film in the exposure/development process, and a photo-mask overlaid on the photosensitive film is adapted so that a photosensitive area of the photosensitive film extends into the cavity opening from the upper edge of the inner wall of the cavity opening by at least 40 µm.

The step for releasing the photosensitive film may be carried out by swelling the photosensitive film with water.

The step for applying the second plating film may be carried out by an electro-plating of tin or solder.

A step may be added after the step for removing the second plating film, for adhering a heat radiation plate to one surface of the core substrate to close the cavity opening so that the cavity is defined.

The heat radiation plate is preferably adhered to the one surface of the core substrate via resinous adhesive or solder.

A step may be added to form a multi-layer structure by overlaying a circuit board having a cavity opening of different area onto the other surface of the circuit board.

A step may be added, after the step for removing the second plating film, for defining the cavity by adhering a circuit board on the one surface of the core substrate.

BRIEF DESCRIPTION OF THE DRAWINGS

The present invention will be described in more detail below with reference to the preferred embodiments illustrated in the attached drawings: wherein.

DETAILED DESCRIPTION OF THE EMBODIMENTS

Figure 1A:
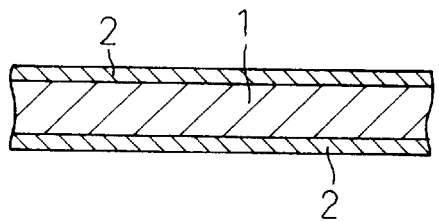
FIGS. 1(a) to 1(i) are illustrations of the steps for producing a circuit board for a plastic package.

Referring now to the drawings, an embodiment of a method for producing a circuit board for a plastic package will be described below.

Figure 1B:
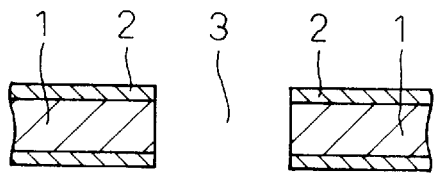
Figure 1C:
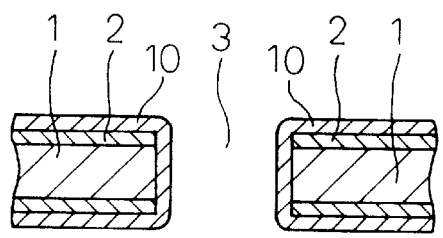
Figure 1D:
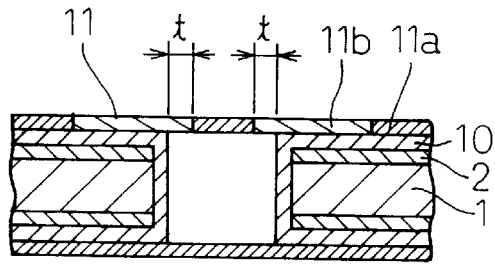
Figure 1E:
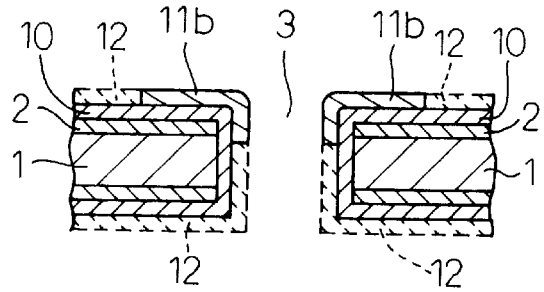
Figure 1F:
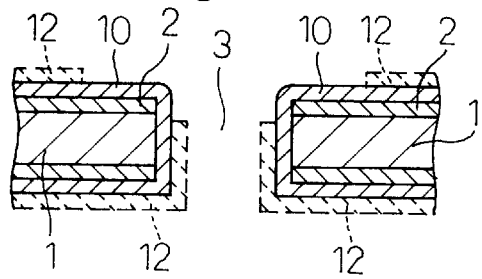
Figure 1G:
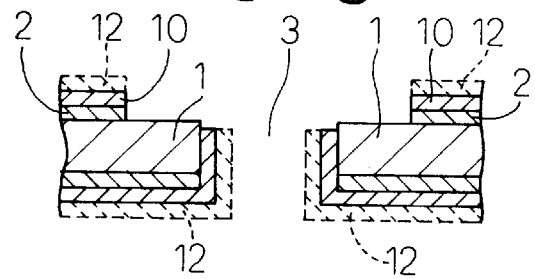
Figure 1H:
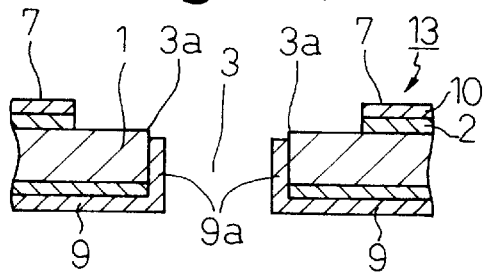
Figure 2:
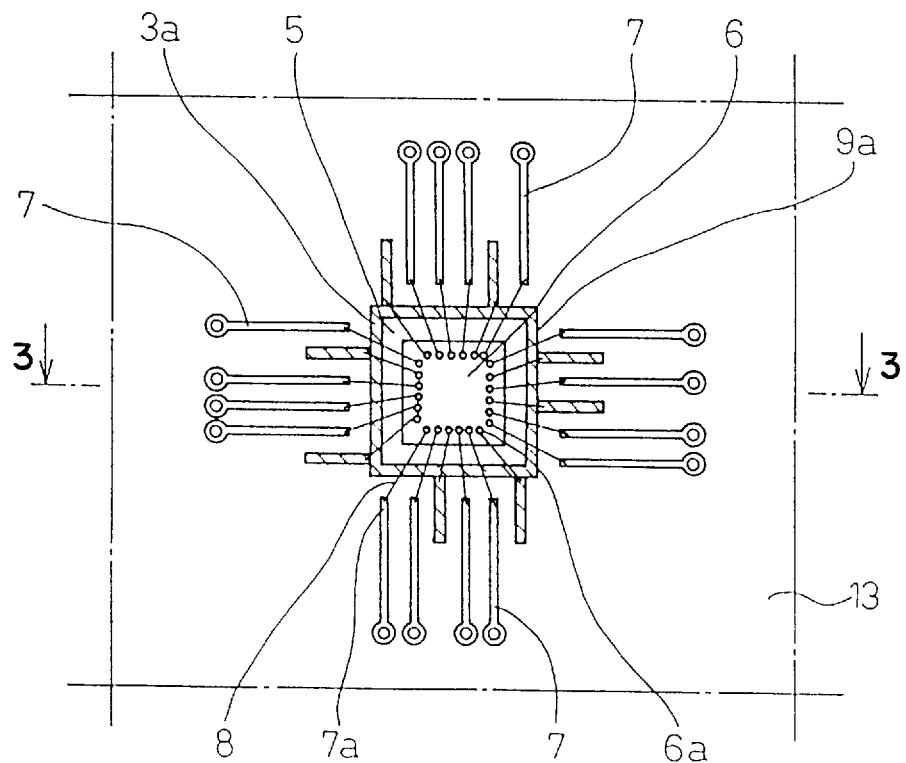
FIG. 2 is a top view of the plastic package.
Figure 3:
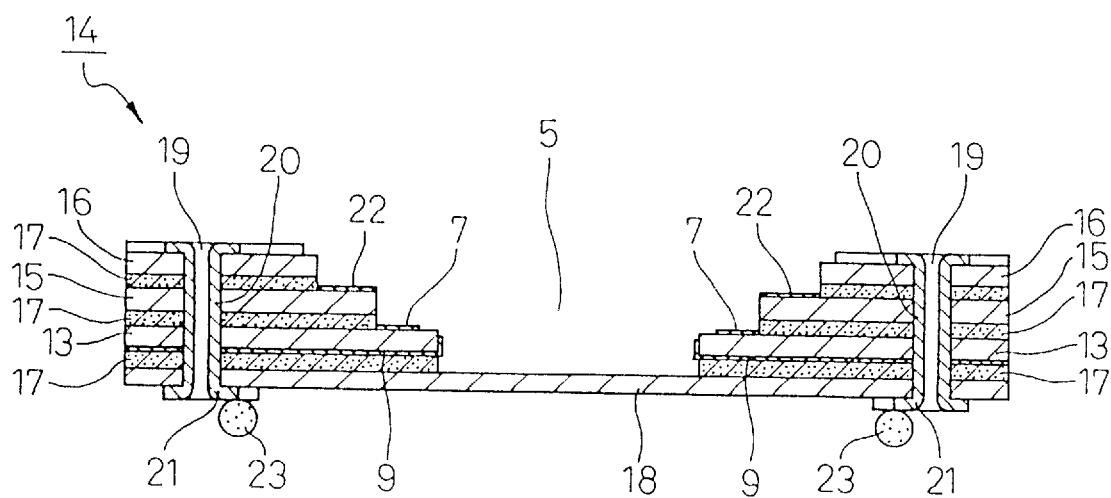
FIG. 3 is a cross-sectional view of a multi-layer circuit board for a plastic package.
Figure 4A:
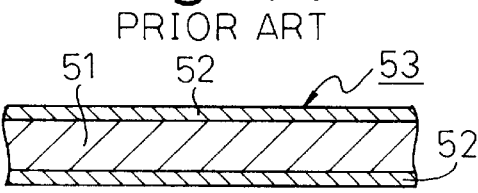
FIGS. 4(a) to 4(i) are illustrations of the conventional steps for producing a plastic package.
Figure 4B:
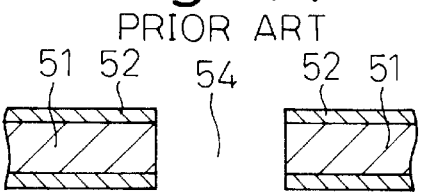
Figure 4C:
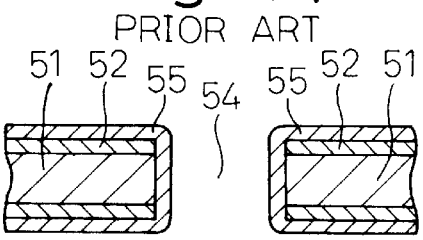
Figure 4D:
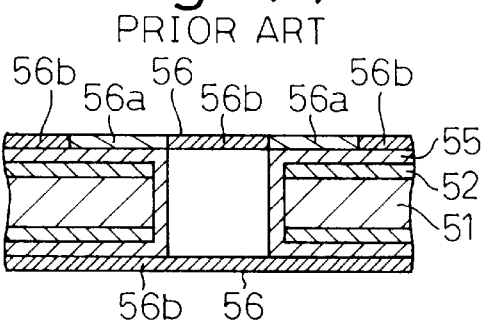
Figure 4E:
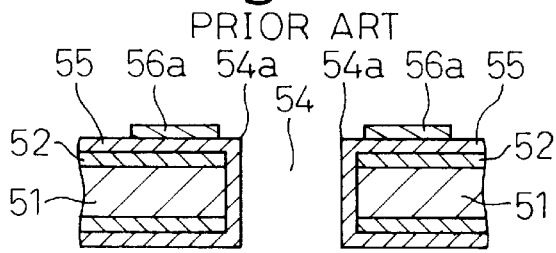
Figure 4F:
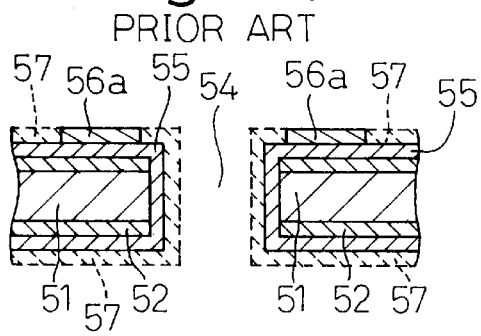
Figure 4G:
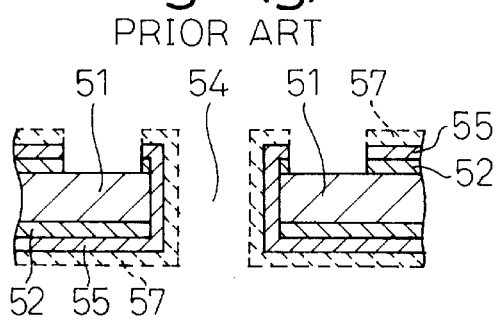
Figure 4H:
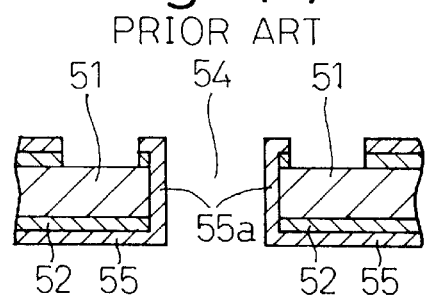
Figure 4I:
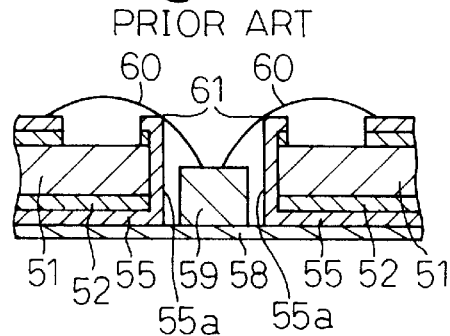

FIG. 1(a) to 1(i) are illustrations of the steps for producing the circuit board for the plastic package; FIG. 2 is a top view of the plastic package; and FIG. 3 is a cross-sectional view of a multi-layer circuit board for the plastic package.

Figure 1I:
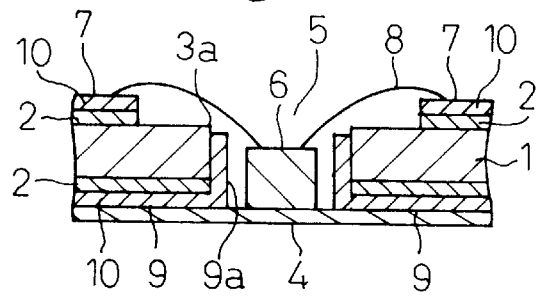

First, a diagrammatic structure of the plastic package will be described with reference to FIGS. 1(i) and 2, wherein FIG. 1(i) is a partial cross-sectional view taken along line A—A in FIG. 2.

With reference to FIG. 1(i), a core substrate 1 is formed of a glass cloth used as a core sheet and copper foils 2 overlaid and bonded onto both surfaces thereof by a hot-press bonding. The glass cloth is made of knitted fabrics of glass fiber which are then impregnated with epoxy resin and overlaid with each other to have a predetermined thickness after being dried.

A through-hole or a cavity opening 3 is formed in the core substrate 1 generally by means of a drill or the like. Then, for example, an electroless plating of copper or copper alloy is applied to the through-hole or the cavity opening 3. Thereafter, an electro plating of copper or copper alloy or a direct plating described later is applied thereto so that circuit patterns carried on both the surfaces are electrically connected to each other.

A cavity 5 is defined by adhering a heat radiation plate 4 on one of the surfaces (a lower surface in FIG. 1(i)) of the core substrate 1 having the cavity opening 3. The heat radiation plate 4 is bonded to the core substrate 1 via a resinous adhesive or a solder. A semiconductor element 6 such as LSI is accommodated within the cavity 5.

As shown in FIG. 2, bonding pads 6a of the semiconductor element 6 are wire-bonded via bonding wires 8 with bonding pads 7a connected to upper circuit patterns 7 such as signal lines or power source lines formed on the other surface of the core substrate 1 (an upper surface in FIG. 1(i)) by mean of a bonding finger not shown. On the lower surface of the core substrate 2 are formed lower circuit patterns 9 such as signal lines, power source lines or a ground layer, and connected to a conductor layer 9a formed on the inner wall of the cavity opening 3. The conductor layer 9a extends upward to a position somewhat lower than an upper edge 3a of the cavity opening 3 (see FIG. 1(i)).

Next, the steps for producing the circuit board for the above plastic package and the package board will be described below with reference to FIGS. 1(a) to 1(i).

The cavity opening 3 is formed by means of a drill in the core substrate 1 shown in FIG. 1(a) (see FIG. 1(b)). The core substrate 1 is a glass cloth substrate having a thickness in a range from 150 µm to 200 µm.

A first plating is applied to the opposite surfaces of the core substrate 1 and the inner wall of the cavity opening 3 to form a first plating film 10 for the purpose of plating the through-hole and forming a circuit pattern on the inner wall of the cavity opening 3, which is connected to the lower circuit patterns 9 formed on the lower surface of the core substrate 1. Specifically, as shown in FIG. 1(c), copper or copper alloy is plated on the opposite surfaces of the core substrate 1 including the inner wall of the cavity opening 3 to form a layer having a thickness of about 12 µm. The first plating film 10 on the inner wall of the cavity opening 3 is formed by applying an electro-plating of copper or copper alloy onto the wall after palladium cores are adhered, for example, by a direct plating method, or by applying an electro-plating of copper or copper alloy subsequent to an electroless plating of copper or copper alloy.

Next, as shown in FIG. 1(d), a photosensitive film such as a dry film 11 is bonded onto the opposite surfaces of the core substrate 1 by hot-press bonding so that the cavity opening 3 is covered. Preferably, the dry film 11 is a water-soluble dry film having a thickness of about 12 µm, consisting of a cover film of PVA (polyvinyl alcohol) and a photoresist layer overlaid thereon, and a base film of polyester or the like used as a top layer. The dry film is overlaid on the core substrate 1 after the cover film is released.

On the dry film 11 is overlaid a photo-mask not shown having a mask pattern wherein a non-photosensitive area 11a corresponds to the upper circuit patterns 7 and the lower circuit patterns 9, and a photosensitive area 11b corresponds to the cavity opening 3 but has a diameter somewhat smaller than that of the cavity opening 3.

Upon exposure and development while using the dry film 11, as shown in FIG. 1(e), the photosensitive area 11b is hardened while extending inward over the upper edge 3a of the cavity opening 3 at a predetermined distance. On the other hand, the non-photosensitive area corresponding to the circuit patterns is dissolved during the development. The mask pattern of the photo-mask overlaid on the dry film 11 is preferably defined so that the photosensitive area 11b extends inward over the upper edge 3a of the cavity opening 3 at least at a distance t=40 $\mu$m while taking an expansion/contraction of the core substrate 1 into account. The above distance t may be changed as required.

Thereafter, if necessary, an electroplating of copper or copper alloy may be applied to an area corresponding to the upper circuit patterns 7 and the lower circuit patterns 9 plated with copper or copper alloy, so that the circuit patterns stand up above the surface.

Then, a second plating film 12 is formed by applying a second plating to an area where the first plating film 10 exposed after the exposure/development of the dry film 11 (corresponding to the circuit patterns) while using the dry film 11 as a mask. Specifically, tin or solder is plated by an electro-plating. Thereby, a tin-plating layer or a solder-plating layer having a thickness in a range from 12 to 13 $\mu$m is formed on the circuit patterns and the inner wall of the cavity opening 3 (see a broken line in FIG. 1(e)).

Next, as shown in FIG. 1(f), the hardening dry film 11 adhered to the opposite surfaces of the core substrate 1 is moistened and swollen with water sprayed thereonto, and is thus released from the opposite surfaces of the core substrate 1. Thus, a portion wherein the second plating film 12 is overlaid on the first plating film 10 along the circuit pattern and a portion wherein the first plating film 10 is solely formed are mixedly present on the opposite surfaces of the core substrate 1.

As shown in FIG. 1(g), the portion wherein the first plating film 10 and the underlying copper foil 2 are formed is dissolved and removed by using as a mask the portion whereon the second plating film 12 is applied. Thereby, the circuit patterns having the second plating film 12 as a top layer is exposed on the opposite surfaces of the core substrate 1. Since the dry film 11 has been formed while extending over the upper edge 3a of the cavity opening 3 on the inner wall thereof during the exposure/development step, this portion is removed together with metallic portions other than the circuit patterns by an etching. As a result, the portion carrying the second plating film 12 continuous to the lower circuit pattern 9 is formed solely in an area of the inner wall of the cavity opening 3, the upper limit of which is lower than the upper edge 3a.

Next, as shown in FIG. 1(h), the second plating film 12 covering the portion corresponding to the circuit patterns on the core substrate 1 and the inner wall of the cavity opening is dissolved and removed so that the upper circuit patterns 7 and the lower circuit patterns 9 carrying the first plating film 10 as a top layer are exposed, whereby a single-layer circuit board 13 is obtained. At this time, the conductor layer 9a connected to the lower circuit patterns 9 is exposed on the inner is wall of the cavity opening 3, while extending to a position lower than the upper edge 3a.

Next, as shown in FIG. 1(i), the heat radiation plate 4 made, for example, of a copper plate is adhered to the lower surface of the circuit board 13 via resinous adhesive or solder so that the cavity opening 3 is closed, whereby the cavity 5 is defined. The semiconductor element 6 such as LSI is mounted on the heat radiation plate 4 defining the cavity 5. In this regard, a resinous substrate (such as a glass-epoxy substrate) may be adhered to the lower surface of the circuit board 13, alternatively to the heat radiation plate 4.

The bonding pads 6a of the semiconductor element 6 are wire-bonded to the bonding pads 7a connected to the upper circuit patterns 7 having the signal lines, power source lines or others via bonding wires 8 by means of the bonding finger not shown, whereby the plastic package is produced.

Since the bonding wire 8 is bonded so that it is streched from the inside of the cavity opening 3 to the upper surface of the circuit board 13, there is a risk that the bonding wire 8 may be brought into contact with the upper edge 3a of the cavity opening 3. If the conductor layer 9a connected to the lower circuit patterns 9 were formed even on the upper edge 3a, there might be a risk of short-circuiting the signal line.

On the contrary, according to this embodiment, since the dry film 11 is hardened while extending inward from the upper edge 3a of the cavity opening 3 at the predetermined distance and used as a resist for the conductor layer 9a to be formed on the inner wall of the cavity opening 3 while being connected to the lower circuit patterns 9, the finally formed conductor layer 9a does not reach the upper edge 3a of the cavity opening 3 at a predetermined vacant space therefrom, whereby a short-circuit is prevented from occurring even if the bonding wire is brought into contact with the upper edge 3a of the cavity opening 3. Thus, it is possible to improve the yield in the production of plastic packages as well as the quality of the resultant packages.

In the above process for producing the circuit board 13, the distance t by which the photosensitive portion 11b of the dry film 11 extends into the cavity opening 3 may be changed in accordance with thicknesses and degrees of expansion/contraction of the core substrate 1.

Also, a circuit board for a semiconductor package is not limited to a single layer type 13 as described above, but may be a multi-layer type 14 as shown in FIG. 3, which is formed by repeating the overlaying of another circuit board having a cavity opening of a different area on the upper surface of the circuit board 13.

In FIG. 3, a laminate is formed by sequentially bonding substrates 15 and 16 carrying conductor layers, respectively, with the upper surface of the circuit board 13 via adhesive sheets 17, and a substrate 18 carrying a conductor layer is bonded with the lower side of the cavity opening 3 via the adhesive sheet 17. The substrate 15 is a resinous substrate having a predetermined circuit pattern formed by etching a conductor layer and having a cavity opening to a different area. While, the substrate 16 is a resinous substrate having a non-etched conductor layer, and after being overlaid with the substrate 15, is bored by a drill, to open a top surface of the laminate, so that a cavity 5 is defined. The substrate 18 is a resinous substrate which is not subjected to a drilling and an etching of the conductor layer.

The steps for producing the above multi-layer circuit board will be described below. The substrates 15, 16 are sequentially overlaid via the adhesive sheets 17 on the upper side of the circuit board 13 shown in FIG. 1(h), and the substrate 18 is overlaid via the adhesive sheet 17 on the lower side thereof, which are heated and pressed together to form an integral laminate. A through-hole 19 is bored through the laminate by a drill, and a conductive plating layer 20 (for example, a copper-plating layer) is formed on the inner wall of the through-hole 19 by an electroless plating. After applying an electro-plating (for example, of copper) onto the plating layer 20 and the outer surfaces of the substrates 16, 18, the conductor layer on the outer surface of the laminate is etched to form a circuit pattern such as lands 21 for bonding external terminals.

Then, the cavity 5 is opened by boring the substrate 16 on the upper side of the laminate, and an exposed portion of the upper circuit pattern 22 formed on the internal circuit board 15 is plated with nickel, gold or others. Finally, an external terminal 23 such as a solder ball is bonded to the land 21 to result in the final product. In this regard, it is possible to directly insert a lead pin into the through-hole 17 to define the external terminal.

Also, a resinous substrate (such as a glass-epoxy substrate) may be adhered, alternatively, to the heat radiation plate 4, on the lower surface of the core substrate 1 so that the cavity is defined.

It should be noted that the present invention is not be limited to the above embodiments, but includes various modifications without departing from a spirit of the invention. For example, the multi-layer circuit board 14 may be formed by laminating a larger number of substrates.

As described above, according to the present invention, portions of the resist film formed on the respective surface of the core substrate is removed during the exposure/development process, which portions correspond to the circuit pattern and to the cavity opening but having a diameter smaller than that of the cavity opening, whereby the photosensitive portion of the resist film is hardened while extending inward from the upper edge of the cavity opening at a predetermined distance.

The resist film operates as a resist for the conductor layer to be formed on the inner wall of the cavity opening and connected to the circuit pattern on one surface of the core substrate. Thereby, since the finally formed conductor layer does not reach the upper edge of the cavity opening at a predetermined vacant space therefrom, short-circuiting of the signal line is prevented from occurring even if the bonding wire is brought into contact with the upper edge of the cavity opening. Thus, it is possible to improve the yield in the production of plastic packages as well as the quality of the resultant packages.

We claim:

1. A method for producing a circuit board for a semiconductor package, comprising the steps of:
   forming an opening for a cavity for accommodating a semiconductor element at a predetermined portion of a core substrate having metallic layers on both surfaces thereof,
   forming a first plating film on the inner wall of the cavity opening to be connected to a circuit pattern formed on at least one surface of the core substrate, forming a resist film on both the surfaces of the core substrate so that the cavity opening is covered,
   removing a portion of the resist film corresponding to the circuit pattern on the core substrate and a portion thereof corresponding to the cavity opening but having a diameter smaller than that of the cavity opening by an exposure/development process,
   forming a second plating film while using the resist film as a mask, on a portion corresponding to the circuit pattern exposed on the core substrate and the first plating film formed on the inner wall of the cavity opening,
   releasing the resist film from both the surfaces of the core substrate,
   removing a portion of the first plating film exposed on the core substrate and the underlying metallic layer, and
   removing the second plating film covering the portion corresponding to the circuit pattern of the core substrate and the inner wall of the cavity opening.

2. A method for producing a circuit board for a semiconductor package as defined by claim 1, wherein the step for forming the first plating film is carried out by applying an electroless plating of copper or copper alloy and subsequently applying an electro-plating of copper or copper alloy.

3. A method for producing a circuit board for a semiconductor package as defined by claim 1, wherein the step of forming the first plating film is carried out by adhering palladium cores on the inner wall of the cavity opening and subsequently applying an electro-plating of copper or copper alloy.

4. A method for producing a circuit board for a semiconductor package as defined by claim 1, wherein an electro-plating of copper or copper alloy is applied to the portion corresponding to the circuit pattern carrying the first plating film prior to applying the second plating.

5. A method for producing a circuit board for a semiconductor package as defined by claim 1, wherein a photosensitive film is used as the resist film in the exposure/development process, and a photo-mask overlaid on the photosensitive film is adapted so that a photosensitive area of the photosensitive film extends into the cavity opening from the upper edge of the inner wall of the cavity opening by at least 40 $\mu$m.

6. A method for producing a circuit board for a semiconductor package as defined by claim 5, wherein the step for releasing the photosensitive film is carried out by swelling the photosensitive film with water.

7. A method for producing a circuit board for a semiconductor package as defined by claim 1, wherein the step for applying the second plating film is carried out by an electro-plating of tin or solder.

8. A method for producing a circuit board for a semiconductor package as defined by claim 1, wherein a step is added after the step for removing the second plating film, for adhering a heat radiation plate to one surface of the core substrate to close the cavity opening so that the cavity is defined.

9. A method for producing a circuit board for a semiconductor package as defined by claim 8, wherein the heat radiation plate is adhered to the one surface of the core substrate via resinous adhesive or solder.

10. A method for producing a circuit board for a semiconductor package as defined by claim 8, wherein a step is added for forming a multi-layer structure by overlaying a circuit board having a cavity opening of different area onto the other surface of the circuit board.

11. A method for producing a circuit board for a semiconductor package as defined by claim 8, wherein a step is added, after the step for removing the second plating film, for defining the cavity by adhering a circuit board on the one surface of the core substrate.

* * * * *

UNITED STATES PATENT AND TRADEMARK OFFICE
CERTIFICATE OF CORRECTION

PATENT NO.:   5,858,816
DATED     :   January 12, 1999
INVENTOR(S):  Hiroaki SATO It is certified that error appears in the above-identified patent and that said Letters Patent is hereby corrected as shown below:

On the title page, [73] Assignee, after "Co.," insert --Ltd.--.

Signed and Sealed this

Tenth Day of August, 1999

Attest:

Q. TODD DICKINSON

*Attesting Officer*      *Acting Commissioner of Patents and Trademarks*